United States Patent
Shih et al.

(10) Patent No.: US 6,362,035 B1
(45) Date of Patent: Mar. 26, 2002

(54) CHANNEL STOP ION IMPLANTATION METHOD FOR CMOS INTEGRATED CIRCUITS

(75) Inventors: Jiaw-Ren Shih; Shui-Hung Chen; Jian-Hsing Lee; Hsien-Chin Lin, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/498,741

(22) Filed: Feb. 7, 2000

(51) Int. Cl.[7] .............................................. H01L 21/44
(52) U.S. Cl. ...................... 438/199; 438/221; 438/223; 438/224; 438/227; 438/231; 438/298; 438/420; 438/451; 438/529; 438/919; 438/526; 257/369; 257/374
(58) Field of Search ................................ 438/199, 221, 438/223, 224, 227, 231, 298, 420, 451, 529, 919, 526; 257/369, 374

(56) References Cited

U.S. PATENT DOCUMENTS

| | | | | |
|---|---|---|---|---|
| 4,710,477 A | * | 12/1987 | Chen | 438/420 |
| 4,839,301 A | | 6/1989 | Lee | 437/29 |
| 5,073,509 A | | 12/1991 | Lee | 437/34 |
| 5,141,882 A | * | 8/1992 | Komori | 438/450 |
| 5,212,100 A | | 5/1993 | Groves et al. | 437/17 |
| 5,252,504 A | * | 10/1993 | Lowrey | 438/210 |
| 5,478,759 A | * | 12/1995 | Mametrani et al. | 438/226 |
| 5,501,993 A | | 3/1996 | Borland | 437/34 |
| 5,573,963 A | * | 11/1996 | Sung | 438/217 |
| 5,604,150 A | | 2/1997 | Mehrad | 437/70 |
| 5,795,803 A | * | 8/1998 | Takamura et al. | 438/228 |
| 5,814,866 A | | 9/1998 | Borland | 257/369 |
| 5,821,589 A | | 10/1998 | Borland | 257/369 |
| 5,985,743 A | * | 11/1998 | Gardner | 438/527 |
| 5,843,814 A | | 12/1998 | Manning | 438/202 |
| 5,929,493 A | * | 7/1999 | Wu | 257/369 |
| 5,930,617 A | * | 7/1999 | Wu | 438/233 |
| 6,136,636 A | * | 10/2000 | Wu | 438/231 |
| 6,294,416 B1 | * | 9/2001 | Wu | 438/199 |

OTHER PUBLICATIONS

S. Wolf, "Silicon Processing for the VLSI Era", vol. 2:Process Integration, Lattice Press, Sunset Beach, CA, (1990), p. 387.

* cited by examiner

Primary Examiner—Caridad L. Everhart
Assistant Examiner—Belur Keshavan
(74) Attorney, Agent, or Firm—George O. Saile; Stephen B. Ackerman

(57) ABSTRACT

A method for incorporating an ion implanted channel stop layer under field isolation for a twin-well CMOS process is described in which the layer is placed directly under the completed field isolation by a blanket boron ion implant over the whole wafer. The channel stop implant follows planarization of the field oxide and is thereby essentially at the same depth in both field and active regions. Subsequently implanted p- and n-wells are formed deeper than the channel stop layer, the n-well implant being of a sufficiently higher dose to over compensate the channel stop layer, thereby removing it's effect from the n-well. A portion of the channel stop implant under the field oxide adjacent the p-well provides effective anti-punchthrough protection with only a small increase in junction capacitance. The method is shown for, and is particularly effective in, processes utilizing shallow trench isolation.

20 Claims, 4 Drawing Sheets

CHANNEL STOP ION IMPLANTATION METHOD FOR CMOS INTEGRATED CIRCUITS

BACKGROUND OF THE INVENTION (1) Field of the Invention

The invention relates to processes for the manufacture of semiconductor devices and more particularly to processes related to the formation of CMOS (complimentary metal oxide silicon) integrated circuits.

(2) Background of the Invention and Description or previous art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. The most widely used semiconductor device is the familiar MOSFET (metal oxide field effect transistor). Both n- and p-channel MOSFETs are used in most integrated circuits and in many instances the two types are used together in a complimentary mode. This technology is referred to as CMOS (complimentary MOS) technology and, because of its low operating current requirements, is one of the most widely used circuit applications.

In order to have these devices essentially side-by-side on the chip, each is formed on a silicon wafer substrate, in a well of a conductivity type opposite to that of the channel type. Thus, n- and p-type wells must first be formed in the silicon surface to accommodate each of the devices. A discussion of twin-well or twin-tub CMOS technology may be found in Wolf, S., "Silicon Processing for the VLSI Era", Vol.2, Lattice Press, Sunset Beach, Calif., (1990), p387ff.

On the silicon surface, a field isolation provides insulation between active elements of two adjacent devices. When the spacing between the devices becomes small, an interaction between two adjacent CMOS structures occurs beneath the field isolation. This interaction is commonly referred to as punchthrough. In order to prevent punchthrough a channel-stop or anti-punchthrough implant of higher dopant concentration than the well, is placed beneath the field isolation. Unfortunately, this increases the junction capacitance of the devices and consequently degrades circuit performance. By making the field isolation deeper and placing the channel stop implant deeper accordingly, the junction capacitance is improved. However, in integrated circuit processes where the field isolation is angled, such as in LOCOS (local oxidation of silicon) isolation or in wet etched recessed trench isolation, the trench angle limits the lateral spacing of the devices. Incorporating a deeper trench, therefore, necessitates a wider spacing with a consequent loss of circuit density. It would therefore be useful to have an improved channel stop which would provide a high degree of punchthrough protection with minimal sacrifice of junction capacitance. The present invention provides a method for forming such a channel stop. The method taught by the present invention is also applicable for integrated circuits with STI (shallow trench isolation).

Manning, U.S. Pat. No. 5,843,814 forms a BiCMOS, an integrated circuit having both n- and p-channel MOSFETs and bipolar transistors. The patterned boron implant which forms the base of the bipolar transistor also places a channel stop region beneath the field isolation adjacent to the n-channel device. The n-channel device is built directly in the p-type substrate, rather than in a p-well. Borland, U.S. Pat. No. 5,821,589, and U.S. Pat. No. 5,814,866 places a blanket, very deep, p-type buried layer beneath both n- and p-wells by using a 2MeV boron implant. The technique, involving multiple implants, provides a boron distribution under the field oxide connecting to the buried layer. This vertical p-type pillar isolation prevents lateral interaction of parasitic devices known as latch-up. Borland, U.S. Pat No. 5,501,993 shows a method for surrounding a well of one type with one of the opposite type to prevent latch-up.

Mehrad, U.S. Pat. No. 5,604,150 shows a supplemental high energy boron channel stop implanted into a p-well after the field oxide is grown. The high energy implant prevents the occurrence of an n-skin under the field oxide which results from the combined effects of boron depletion and phosphorous accumulation during the field oxidation. The supplemental high energy channel stop is directly under the field oxide but is deeper under the active areas. Lowery, et. al., U.S. No. 5,252,504 implants a boron channel stop, using the field oxide mask before the field oxide is grown by LOCOS. The nitride field oxide mask blocks the implant over the active regions. Lee, U.S. Pat. No. 4,839,301 and U.S. Pat. No. 5,073,509 show methods for forming p-type channel stops for CMOS structures by using the LOCOS field oxide mask to protect the active areas. The boron ion implants are performed prior to LOCOS field oxidation.

In instances wherein the channel stop implant precedes a LOCOS field oxidation, the implant is shallow, being just below the surface of the silicon in the field regions. During the field oxidation the boron is driven advantageously deeper, ahead of the oxidation front. It is however depleted at the oxidation front. When the channel stop implant is delivered after the field oxide is grown, as in Mehrad, the boron is implanted deeper in the active regions than under the field oxide because the LOCOS field oxide thickness is about twice that of the silicon consumed by the oxidation. In addition boron depletion under the field oxide is overcome or avoided.

While in Mehrad, the increased depth of the boron field implant (channel stop) will advantageously lower the junction capacitance between a n+to device element in the p-well, the effect of the same implant in a corresponding n-well of a CMOS pair would be disadvantageous because a higher n-well implant dosage would be required to sufficiently overcompensate the p-type field implant and thereby cause an imbalance in CMOS performance. Thus, in the framework of Mehrad, a blanket channel stop implant is only suitable where the circuit devices are all of the same type.

SUMMARY OF THE INVENTION

It is an object of this invention to provide an improved method for forming a channel stop region in a twin-well CMOS integrated circuit with reduced junction capacitance without sacrificing anti-punchthough effectiveness.

It is another object of this invention to provide an improved method for forming a channel stop region in a twin-well CMOS integrated circuit without requiring photolithographic masking.

It is yet another object of this invention to provide a method for improving the isolation performance of a twin-well CMOS integrated circuit.

It is still another object of this invention to provide a method for forming a blanket boron field implant which may be overcompensated in an n-well of a CMOS structure without degrading balanced CMOS device performance.

These objects are accomplished by ion implanting a boron channel stop layer after the field isolation has been formed and the surface of the wafer planarized. The dosage and the energy of the implantation is chosen so as to place the centroid of the implant just below the bottom of the field isolation, assuring that the entire region of the channel stop abutting the base of the field isolation over the p-well remains strongly p-type, while at the same low enough so that the dosage of the n-well implantation is sufficient to over compensate the p-dopant in the n-well.

DESCRIPTION OF THE PREFERRED EMBODIMENTS

Figure 1A:
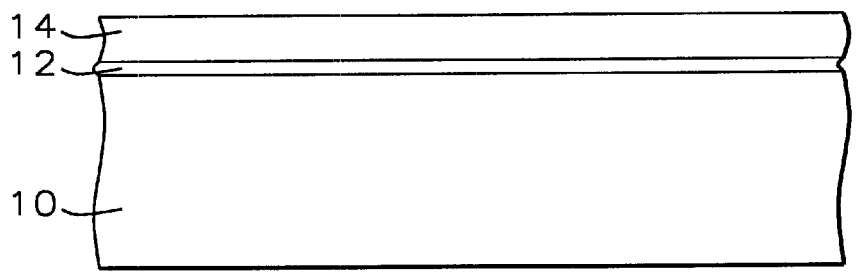
FIG. 1a through FIG. 1j are cross sections of a portion of a silicon wafer showing process steps used in the formation of shallow trench field isolation and the implantation of a channel stop region for a twin-well CMOS integrated circuit using the method taught by the present invention

In an embodiment of the current invention, a monocrystalline <100> oriented p-type silicon wafer is provided. Referring to FIG. 1a, a pad oxide is formed on the wafer 10 preferably by thermal oxidation. The pad oxide 12 is between about 50 and 100 Angstroms thick. A silicon nitride layer 14 is then deposited onto the pad oxide 12, preferably by LPCVD (low pressure chemical vapor deposition. The silicon nitride layer is between about 500 and 1,000 Angstroms thick.

Figure 1B:
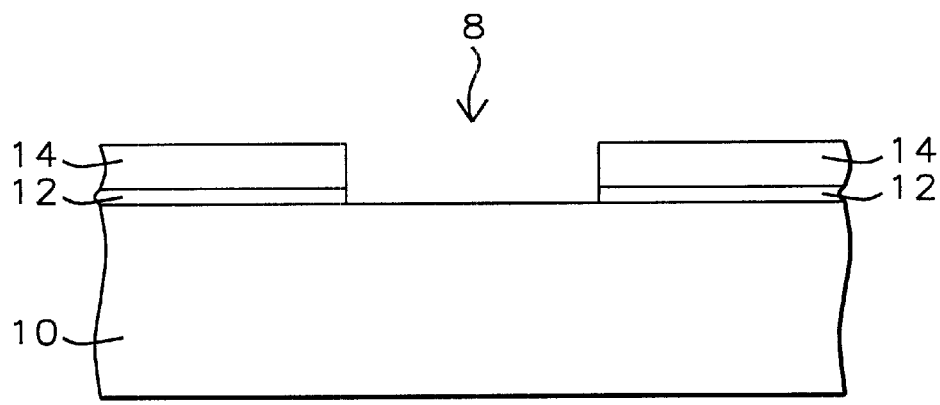

Referring to FIG. 1b, the silicon nitride layer 14 and the subjacent pad oxide 12 are patterned, preferably using photoresist (not shown) and conventional photolithography to define an opening 8. The patterned silicon nitride now comprises a hardmask which will be used to etch an opening or trench in the exposed silicon wherein field oxide isolation is to be formed. The purpose of the pad oxide is to provide a stress buffer beneath the nitride layer to prevent stress induced dislocations during subsequent thermal processing steps. Silicon nitride/pad oxide hardmasks are well known in the art and are widely used to form LOCGOS field isolation as well for etching trenches for STI.

Figure 1C:
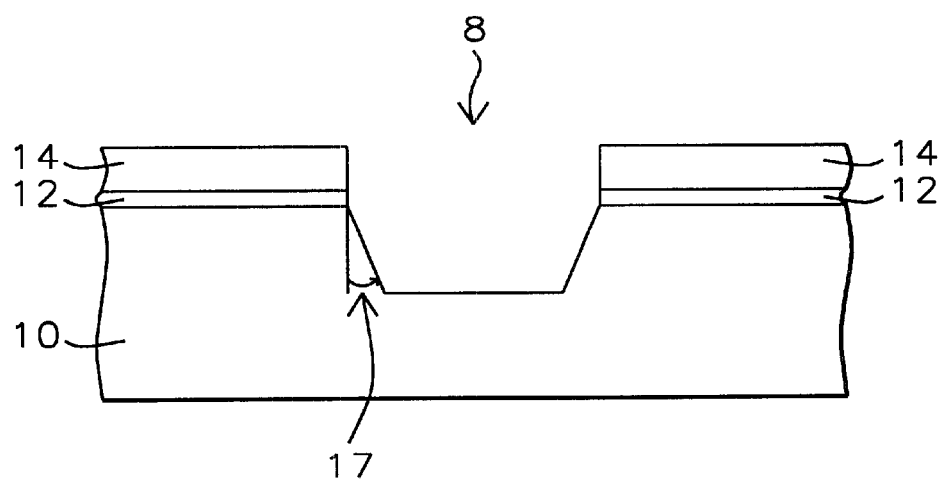

A silicon trench is etched into the wafer 10, preferably by a dry etching method for example RIE (reactive ion etching). Referring to FIG. 1c, the sidewalls 16 of the trench opening 8 may be made nearly vertical or they may be intentionally angled as shown in the figure to form an angle 17 of between about 60 and 80 degrees from the vertical (direction normal to the surface plane of the wafer). A positive trench angle 17 assures that voids will not form in the insulative material which is subsequently conformally deposited to fill the trench. The silicon trench is etched using an etchant gas containing a halogen such as $BrCl_3$ or HBr. The techniques for etching silicon trenches by RIE are well known by those in the art. The trench in the opening 8 is etched to a depth of between about 0.3 and 0.5 microns. The width of the etched trench opening 8 at the wafer surface is between about 0.1 and 1.0 microns. Alternately, the trench 8 may be anisotropically etched by a wet chemical etchant such as alcoholic KOH or by an amine/pyrocatechol formulation. In this case the angle 17 is well defined by the crystalline orientation of the wafer being about 60 degrees.

After etching a protective liner (not shown) is formed in the trench. The liner consists of a layer of clean thermally grown silicon oxide covered with a protective silicon nitride layer. The oxide is between about 100 and 200 Angstroms thick and the silicon nitride layer, preferably deposited by LPCVD is between about 200 and 600 Angstroms thick. The nitride layer not only protects the clear oxide from contamination but also protects the silicon trench wails from oxidation during densification of the trench filler material.

Figure 1D:
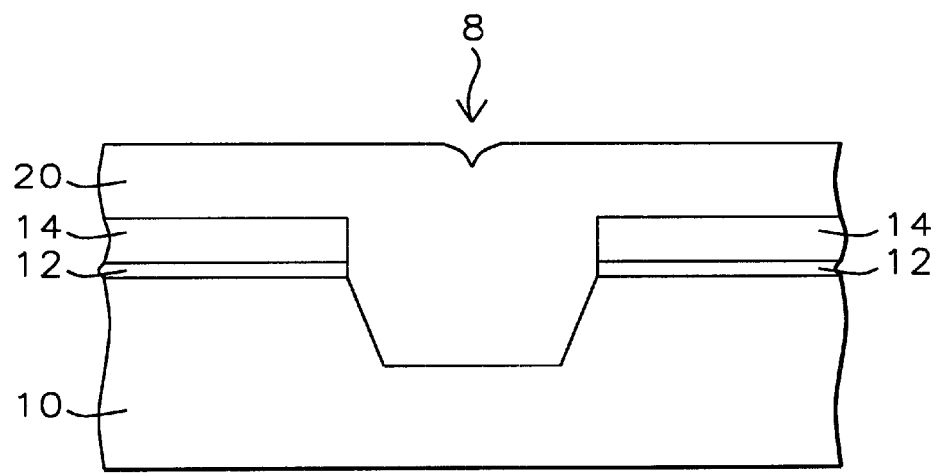

Referring to FIG. 1d, a layer of silicon oxide 20 is deposited, preferably by LPCVD, filling the trench opening 8. The trench oxide 20, is preferably deposited by the thermal decomposition of tetraethoxy orthosilicate(TEOS) which is conformal and may be accomplished at temperatures between 650 and 800° C. Deposition procedures for these various materials are well understood by those in the art.

After deposition, the filler oxide 20 is densified by subjecting the wafer 10 to an ambient of wet oxygen or steam at a temperature of 800° C. or thereabout for a period of about 30 minutes. The surface of the wafer 10 is then subjected to a planarization process, preferably chemical mechanical polishing (CMP). The CMP removes filler material over the planar regions of the wafer and is accomplished until the surface of the wafer is polished into the nitride layer 14. The nitride layer 14 is then removed by etching with hot $H_3PO_4$. Alternately a plasma etch may be used to remove the residual nitride layer 14 using the pad oxide 12 as an etch stop. The pad oxide 12 is then removed by a dip in dilute aqueous HF.

Figure 1E:
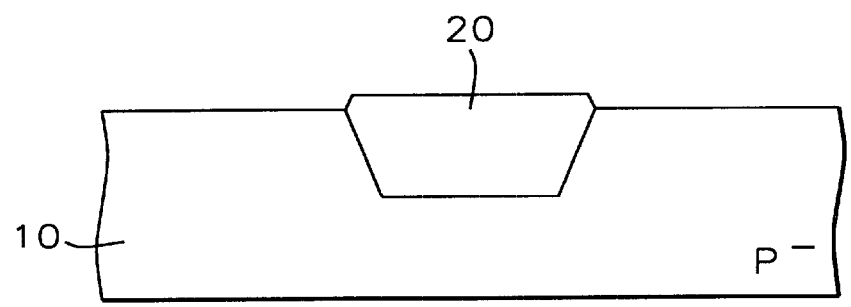

The planarized wafer surface is shown in FIG. 1e. Alternative methods of planarization such as reactive ion etchback may also be employed. CMP and other planarization methods are well known and widely practiced in the semiconductor industry. The filler oxide densification step may alternately be performed after the planarization step.

Figure 1F:
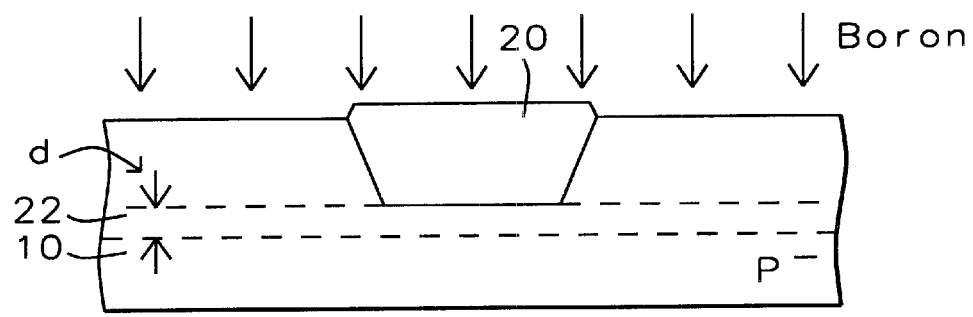

Referring now to FIG. 1f, the wafer 10 is subjected to a blanket boron field implantation. The boron is implanted at a dose of between about $2 \times 10^{12}$ and $6 \times 10^{12}$ boron ions/cm$^2$ at an energy of between about 90 and 140 keV. The energy is selected to place the centroid of the field implant layer 22 between about 50 and 300 Angstroms beneath the base of the trench 8. At these energies the breadth "d" of the boron implant layer 22 in the silicon is between about 200 and 600 Angstroms. The range of boron in oxide at these energies is about the same as that in silicon and, because the oxide in the trench is essentially co-planar with the silicon surface, the overall depth of the field implant layer 22 is the same in both active and field regions.

Figure 1G:
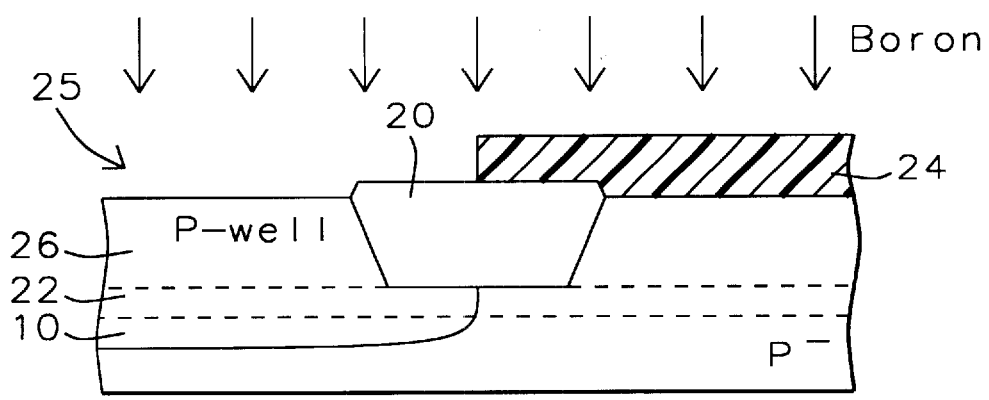

Referring to FIG. 1g, photoresist 24 is patterned to expose a region 25 on one side of the field isolation 20 wherein a p-well is to be formed. An n-channel MOSFET will later be formed in this p-well. The exposed portion of the patterned photoresist 24 also overlaps the field isolation 20 to an extent that approximately half of the width of the shallow trench field isolation 20 is exposed. Boron ions are implanted into the region 25 at a dose of between about $1 \times 10^{13}$ and $2 \times 10^{13}$ ions/cm$^2$ and at an energy between about 150 and 180 keV to form a p-well 26. The enhanced boron concentration which forms the p-well 26 extends beneath the field implant layer 22 in the entire p-well region which extends laterally, part way, under the field isolation 20.

Figure 1H:
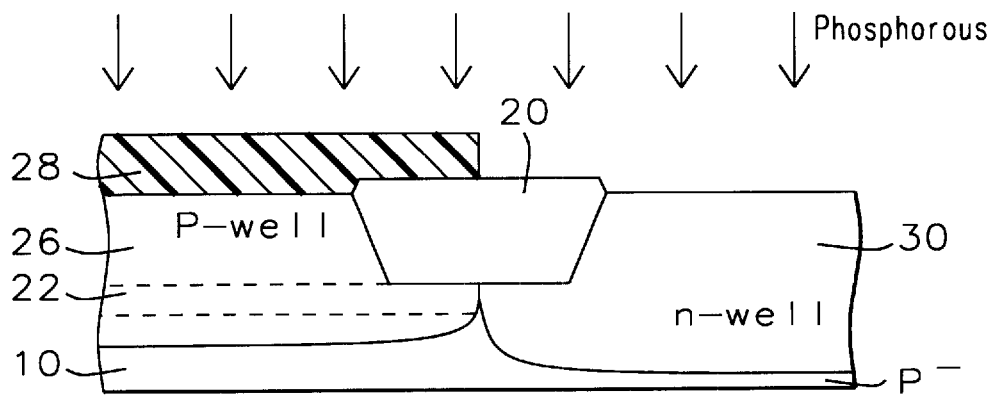

The photoresist mask 24 is then removed either by plasma ashing or with a commercial liquid photoresist stripper, and a second photoresist mask 28 is patterned to define an n-well region on the other side of the field isolation 20. The n-well region exposed by the photoresist mask 28 overlaps the field isolation 20 to an extent that approximately half of the width of the field isolation 20 across the trench is exposed. Referring to FIG. 1h, phosphorous is implanted, using the mask 28, to form an n-well 30. The phosphorous is implanted at a dose of between about $1\times10^{13}$ and $2\times10^3$ ions/cm$^2$ and at an energy of between about 440 and 500 keV. This implanted dose results in a phosphorous concentration greater than that of boron in the field implant layer 22, thereby overcoming the p-type doping, making it n-type and forming an n-well 30 which is deeper than the p-well 26 extending laterally, part way, under the field isolation 20. When sufficient dopant impurities of a first conductivity type are incorporated into a semiconductor region of a second conductivity type, the conductivity of the semiconductor region is said to become compensated. If sufficient impurities of the first conductivity type are added to change the conductivity type of the semiconductor region, the region is said to be over-compensated. In the context of the present convention, the portion of the boron field implant layer 22 in the n-well region is over-compensated by the n-type impurity implant. Because the field implant layer is at a depth well above the base of the n-well the dose of the n-well implant need not be intentionally increased to over compensate the field implant. Thus the n- and p-wells provide balanced CMOS device performance.

Figure 1I:
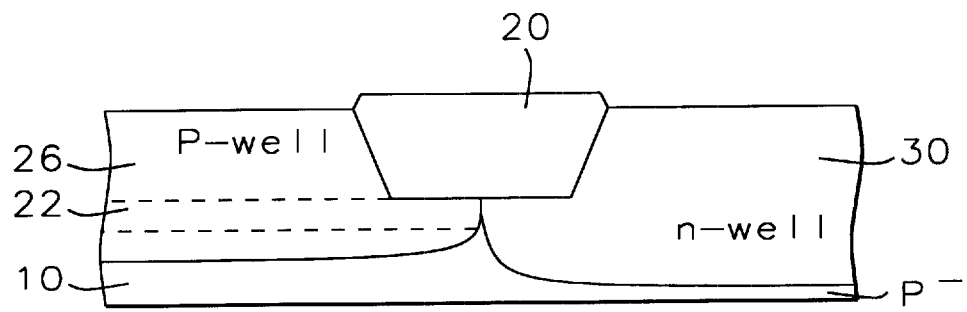

The photoresist mask 28 is removed either by plasma ashing or by using a liquid resist stripper and the wafer 10 is subjected to thermal annealing, preferably by RTA (rapid thermal annealing) at a temperature of between about 850 and 1,050° C. for between about 5 and 20 seconds in a nitrogen ambient to electrically activate the dopant impurities. The completed twin well structure is shown in FIG. 1i. The field implant layer 22 under the STI oxide 20 is a channel stop and provides a high degree of anti-punchthrough protection with little cost in junction capacitance.

Figure 1J:
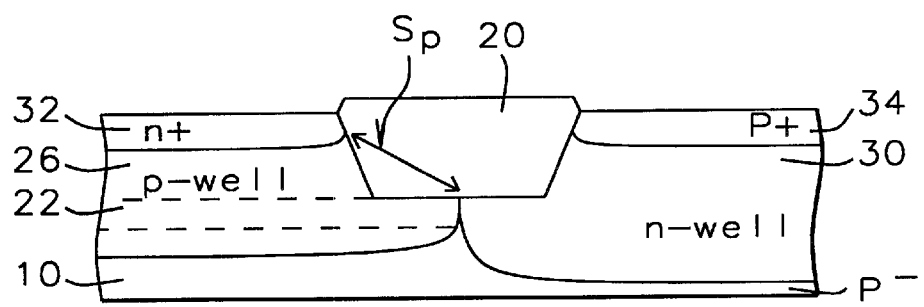

In subsequent processing steps, which are not directly related to this invention, an n-channel MOSFET is fabricated in the p-well 26 and a corresponding p-channel MOSFET is built into the n-well 30 to complete the formation of a CMOS transistor pair. Procedures for the formation of n-channel and p-channel MOSFETs in a CMOS configuration are well known and need not be described here. Referring to FIG. 1j, there is shown a portion 32 of an n-type source/drain element of a n-channel MOSFET, formed in the p-well 26, and a corresponding portion 34 of a p-type source/drain element of the corresponding p-channel MOSFET which has been formed in the n-well 30.

An important parameter which is determines the effectiveness of electrical isolation of the p-channel and n-channel devices is the minimum tolerable spacing between the source/drain element of one device and the well of the other device. This is illustrated in FIG. 1j by the spacing "Sp" between the n-channel device source/drain 32 and the closest point on the n-well 30. In operation, the section of the field implant or channel stop layer 22 located under the field isolation 20 prevents depletion of the p-well under the isolation 20 causing lateral extension of the n-well 30 and thereby reducing the spacing Sp and degrading device isolation. A minimum tolerable value of the spacing Sp is defined by the circuit specifications.

Figure 2:
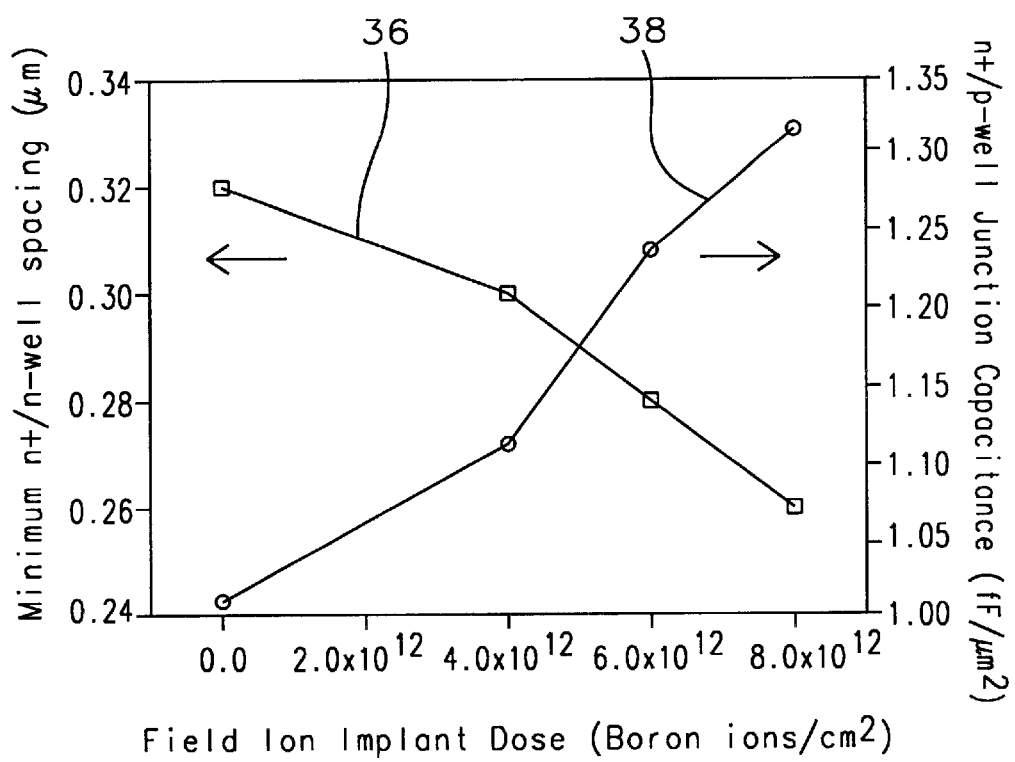
FIG. 2 is a chart which shows the effect of the implanted boron dose of a boron channel stop ion implant on the minimum tolerable n+to source/drain-to-n-well spacing for a given isolation specification when the device structures are formed by the method of the invention.

FIG. 2 is a chart which shows the effect of the implanted boron dose of the channel stop 22 on the minimum tolerable n+to source/drain-to-n-well spacing (curve 36) for a given isolation specification when the device structures are formed by the method of the invention. The corresponding behavior of the junction capacitance of the n-channel device is also shown by curve 38. Comparable behavior is observed for a phosphorous channel stop implant and a p-channel device.

While this invention has been particularly shown and described with reference to the preferred embodiments thereof, it will be understood by those skilled in the art that various changes in form and details may be made without departing from the spirit and scope of the invention. While the embodiments of this invention utilize a p-type silicon substrate, an n-type silicon substrate could also be used without departing from the concepts therein provided.

What is claimed is:

1. A method for forming a channel stop in a twin well CMOS structure with planarized shallow trench field isolation comprising;
   (a) providing a silicon wafer;
   (b) forming a region of planarized shallow trench field isolation in said wafer;
   (c) blanket implanting a first dose of boron ions into said wafer whereby the centroid of said first dose is placed at a distance below the base of said field isolation forming a channel stop layer,
   (d) patterning a first ion implantation mask to expose a p-well region on a first side of said field isolation, said p-well region overlapping a first portion of sa id field isolation;
   (e) implanting a second dose of boron ions into said wafer, thereby forming a p-well;
   (f) patterning a second ion implantation mask to expose an n-well region on a second side of said field isolation, said exposed n-well region overlapping a second portion of said field isolation; and
   (g) implanting a dose of n-type impurity ions into said wafer, thereby forming an n-well, which extends deeper than, and overcompensates, said channel stop layer in said n-well.

2. The method of claim 1 wherein said field isolation is silicon oxide.

3. The method of claim 1 wherein said planarized shallow trench field isolation extends to a depth of between about 0.3 and 0.5 microns beneath the surface plane of said wafer.

4. The method of claim 1 wherein the width of said planarized shallow trench isolation is between about 0.1 and 1.0 microns at the surface of the wafer.

5. The method of claim 1 wherein the sides of said planarized shallow trench isolation forms an angle of between about 60 and 80 degrees with a line normal to the surface of the wafer.

6. The method of claim 1 wherein said first and said second ion implantation masks are photoresist.

7. The method of claim 1 wherein said first dose of boron ions is between about $2\times10^{12}$ and $8\times10^{12}$ ions/cm$^2$ and is implanted at an energy of between about 90 and 140 keV.

8. The method of claim 1 wherein said second dose of boron ions is between about $1\times10^{13}$ and $2\times10^3$ ions/cm$^2$ and is implanted at an energy of between about 150 and 180 keV.

9. The method of claim 1 wherein said dose of n-type impurity ions comprises between about $1\times10^{13}$ and $2\times10^{13}$ phosphorous ions/cm$^2$ implanted at an energy of between about 440 and 500 keV.

10. The method of claim 1 wherein said distance is between about 50 and 300 Angstroms.

11. A method for forming a twin-well CMOS structure with planarized shallow trench field isolation comprising:
   (h) providing a silicon wafer;
   (i) forming a region of planarized shallow trench field isolation in said wafer;
   (j) blanket implanting a first dose of boron ions into said wafer whereby the centroid of said first dose is placed at a distance below the base of said field isolation forming a channel stop layer;

(k) patterning a first ion implantation mask to expose a p-well region on a first side of said field isolation, said p-well region overlapping a first portion of said field isolation;

(l) implanting a second dose of boron ions into said wafer, thereby forming a p-well;

(m) patterning a second ion implantation mask to expose an n-well region on a second side of said field isolation, said exposed n-well region overlapping a second portion of said field isolation;

(n) implanting a dose of n-type impurity ions into said wafer, thereby forming an n-well, which extends deeper than, and overcompensates, said channel stop layer in said n-well; and (o) forming an n-channel MOSFET in said p-well and an p-channel MOSFET in said n-well, thereby forming a twin-well CMOS structure.

12. The method of claim 11 wherein said field isolation is silicon oxide.

13. The method of claim 11 wherein said planarized shallow trench field isolation extends to a depth of between about 0.3 and 0.5 microns beneath the surface plane of said wafer.

14. The method of claim 11 wherein the width of said planarized shallow trench isolation is between about 0.1 and 1.0 microns at the surface of the wafer.

15. The method of claim 11 wherein the sides of said planarized shallow trench isolation forms an angle of between about 60 and 80 degrees with a line normal to the surface of the, wafer.

16. The method of claim 11 wherein said first and said second ion implantation masks are photoresist.

17. The method of claim 11 wherein said first dose of boron ions is between about $2\times10^{12}$ and $8\times10^{12}$ ions/cm$^2$ and is implanted at an energy of between about 90 and 140 keV.

18. The method of claim 11 wherein said second dose of boron ions is between about $1\times10^{13}$ and $2\times10^{13}$ ions/cm$^2$ and is implanted at an energy.

19. The method of claim 11 wherein said dose of n-type impurity ions comprises between about $1\times10^{13}$ and $2\times10^{13}$ phosphorous ions/cm$^2$ implanted at an energy of between about 440 and 500 keV.

20. The method of claim 11 wherein said distance is between about 50 and 300 Angstroms.

* * * * *